(12) United States Patent
Short

(10) Patent No.: US 7,061,947 B2
(45) Date of Patent: Jun. 13, 2006

(54) PARTIALLY MIRRORED BEAM TAP FOR WAVELENGTH LOCKERS

(75) Inventor: Bradley W. Short, Goleta, CA (US)

(73) Assignee: Agility Communications, Inc., Goleta, CA (US)

( * ) Notice: Subject to any disclaimer, the term of this patent is extended or adjusted under 35 U.S.C. 154(b) by 280 days.

(21) Appl. No.: 10/284,734

(22) Filed: Oct. 31, 2002

(65) Prior Publication Data

US 2003/0081637 A1   May 1, 2003

Related U.S. Application Data

(60) Provisional application No. 60/336,387, filed on Nov. 1, 2001.

(51) Int. Cl.
*H01S 3/13* (2006.01)
*H01S 3/08* (2006.01)

(52) U.S. Cl. .................. 372/29.02; 372/32; 372/99; 372/103; 372/107

(58) Field of Classification Search ........... 372/29.021, 372/32, 29.02; 359/629–634, 636, 639, 838
See application file for complete search history.

(56) References Cited

U.S. PATENT DOCUMENTS

| | | | | |
|---|---|---|---|---|
| 4,360,925 A | * | 11/1982 | Brosnan et al. ............ | 372/95 |
| 6,124,956 A | * | 9/2000 | Severn ...................... | 398/28 |
| 6,154,319 A | * | 11/2000 | Rando et al. .............. | 359/618 |
| 6,542,304 B1 | * | 4/2003 | Tacklind et al. ........... | 359/618 |
| 6,587,214 B1 | * | 7/2003 | Munks ....................... | 356/519 |
| 6,621,580 B1 | * | 9/2003 | Myatt et al. ............... | 356/519 |
| 6,735,224 B1 | * | 5/2004 | Murry et al. ............... | 372/20 |
| 6,765,939 B1 | * | 7/2004 | Baillargeon et al. ....... | 372/32 |
| 6,788,717 B1 | * | 9/2004 | Yokoyama ................ | 372/29.01 |
| 6,859,330 B1 | * | 2/2005 | Kozlovsky et al. ........ | 359/634 |
| 2003/0016709 A1 | * | 1/2003 | Flanders ..................... | 372/26 |
| 2003/0035120 A1 | * | 2/2003 | Myatt et al. ............... | 356/519 |

* cited by examiner

*Primary Examiner*—Armando Rodriguez
(74) *Attorney, Agent, or Firm*—Allen, Dyer, Doppelt, Milbrath & Gilchrist, P.A.

(57) ABSTRACT

A partially mirrored beam tap for use in wavelength and power monitoring, wherein the partially mirrored beam tap splits off at least two beams from an elliptical Gaussian output beam, wherein a first split-off beam is transmitted to an etalon and one or more first photo-detectors for wavelength monitoring, while a second split-off beam is transmitted to one or more second photo-detectors as a reference and for power monitoring. The partially mirrored beam tap splits off the first and second split-off beams from upper and lower tails of the output beam, wherein upper and lower portions of the partially mirrored beam tap comprise mirrored surfaces that reflect tails of the output beam and a center portion of the partially mirrored beam tap comprises a clear rectangular aperture that passes the output beam.

9 Claims, 6 Drawing Sheets

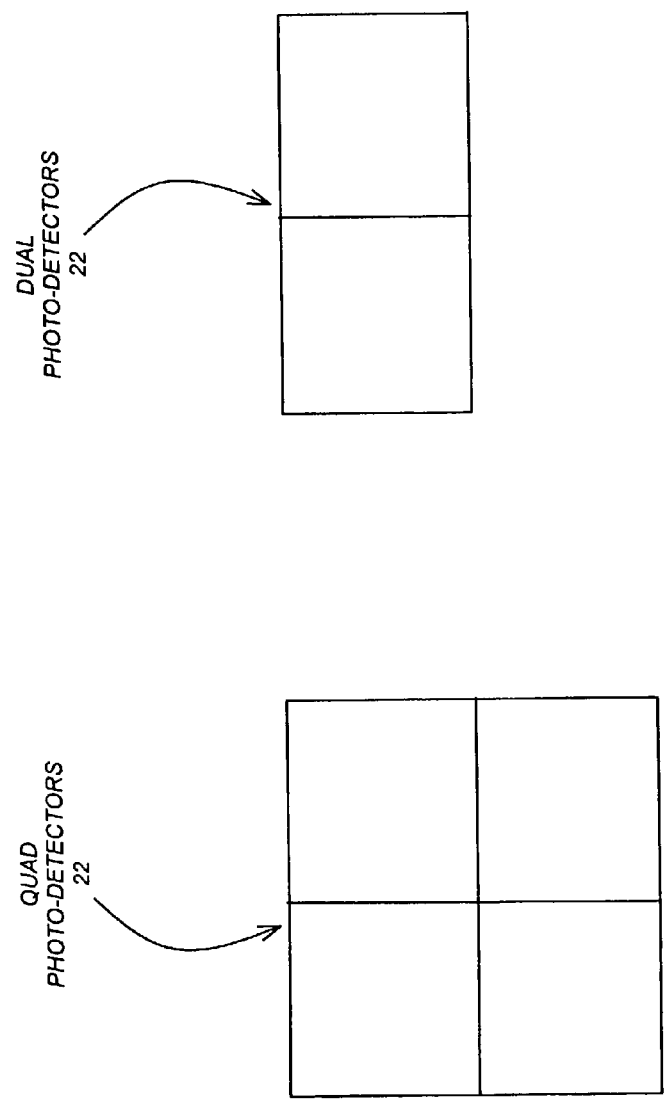

PARTIALLY MIRRORED BEAM TAP FOR WAVELENGTH LOCKERS

CROSS-REFERENCE TO RELATED APPLICATIONS

This application claims the benefit under 35 U.S.C. §119 (e) of co-pending and commonly-assigned U.S. provisional patent application Ser. No. 60/336,387, filed Nov. 1, 2001, by Bradley W. Short, and entitled "PARTIALLY MIRRORED BEAM TAP, ANAMORPHIC PRISM AND COMPACT SINGLE BEAM SPLITTER BASED WAVELENGTH LOCKERS," which application is incorporated by reference herein.

This application is related to and commonly-assigned U.S. utility patent application Ser. No. 10/284,733, filed on Oct. 31, 2002, by Bradley W. Short, and entitled "ANAMORPHIC PRISM WAVELENGTH LOCKER," now U.S. Pat. No. 6,765,940, issued Jul. 20, 2004, which application is incorporated by reference herein.

BACKGROUND OF THE INVENTION

1. Field of the Invention

The invention relates to the field of wavelength lockers used in conjunction with widely tunable lasers, and more particularly, to a partially mirrored beam tap for wavelength lockers.

2. Description of the Related Art

There are a variety of semiconductor laser designs in which the wavelength can be tuned by current injection into one or more sections of the laser that have some spectral filtering characteristics. Examples include moderately-tunable devices, such as distributed Bragg reflector (DBR) lasers, and widely-tunable devices, such as sampled grating distributed Bragg reflector (SGDBR) lasers.

In each of these devices, precise control of each of the currents provided to the various sections of the laser is required to achieve a desired output wavelength. The amount of current injected into each section to achieve a given wavelength can vary with both device temperature and aging. For example, over time, as the device ages, changes in leakage current and carrier lifetime in the tuning sections cause the laser output wavelength to drift. This variation in tuning characteristics requires the use of some sort of feedback control system in order for such tunable lasers to be used in applications where precise wavelength control must be maintained, such as dense wavelength division multiplexed (DWDM) communications systems.

One type of feedback control is known as a wavelength locker. A wavelength locker is used for stabilizing the laser output wavelength at one of a plurality of channels. However, prior art wavelength lockers greatly reduce optical output, because they tap too large a portion of the light for wavelength locking, thereby reducing fiber coupling efficiencies. Moreover, prior art wavelength lockers are not especially compact, and thus are not easily integrated into laser device packaging. In addition, prior art wavelength lockers have not been cost effective.

Therefore, there is a need in the art for a wavelength locker that does not reduce optical output as much, so that fiber coupling efficiencies are not as reduced. In addition, there is a need in the art for a wavelength locker that is more easily integrated into laser packaging. Moreover, there is a need in the art for a wavelength locker that is cost effective.

SUMMARY OF THE INVENTION

The present invention describes a wavelength locker for use in monitoring a wavelength and power of an elliptical Gaussian output beam from a laser, wherein the wavelength locker comprises a partially mirrored beam tap for splitting off at least two beams from the output beam, wherein a first split-off beam is transmitted to an etalon and one or more first photo-detectors for wavelength monitoring, while a second split-off beam is transmitted to one or more second photo-detectors as a reference and for power monitoring. The partially mirrored beam tap splits off the first and second split-off beams from upper and lower tails of the output beam, wherein upper and lower portions of the partially mirrored beam tap comprise mirrored surfaces that reflect tails of the output beam and a center portion of the partially mirrored beam tap comprises a clear rectangular aperture that passes the output beam.

BRIEF DESCRIPTION OF THE DRAWINGS

Referring now to the drawings in which like reference numbers represent corresponding parts throughout:

FIGS. 6A and 6B illustrate possible alternative configurations of the photo-detectors.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Many laser diodes require high fiber coupling efficiencies as well as wavelength locking. The present invention describes a wavelength locker including a partially mirrored beam tap that meets these requirements. Using the present invention, it is possible to reduce the impact of the tapped light upon optical output and fiber coupling efficiencies. Moreover the present invention reduces component size and cost for the wavelength locker.

Figure 1:
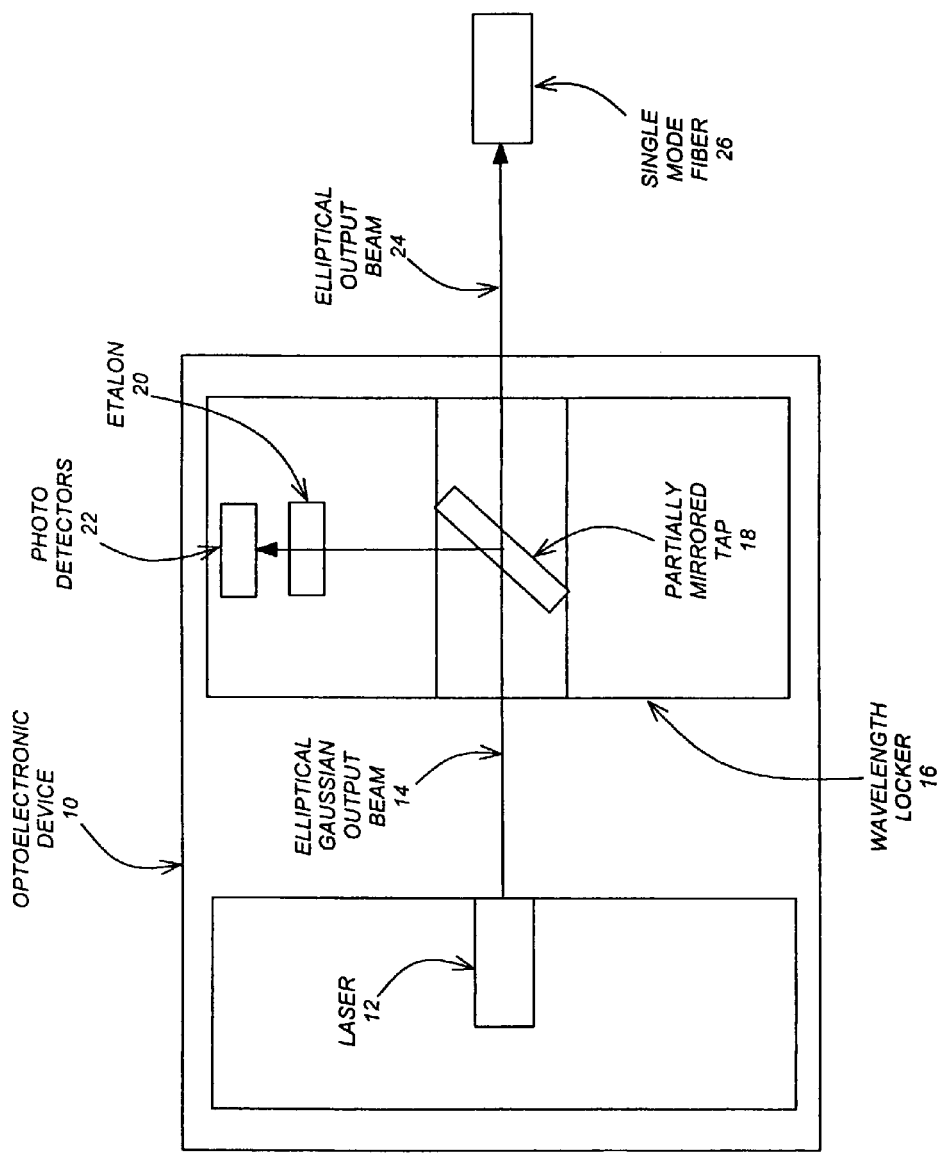
FIG. 1 illustrates the structure of an optoelectronic device according to the preferred embodiment of the present invention.

FIG. 1 illustrates the structure of an optoelectronic device according to the preferred embodiment of the present invention. The optoelectronic device 10 includes a laser 12 that generates an elliptical Gaussian output beam 14 and a wavelength locker 16. In a preferred embodiment, the wavelength locker 16 includes a planar partially mirrored beam tap 18 for splitting off at least two beams from the output beam, wherein a first split-off beam is transmitted to an etalon 20 and one or more first photo-detectors 22 for wavelength monitoring and a second split-off beam is transmitted to one or more second photo-detectors 22 as a reference and for power monitoring.

The partially mirrored beam tap 18 therefor performs as a beam splitter to tap a small percentage of the optical power of the elliptical Gaussian output beam 14 for wavelength and power monitoring. Specifically, the first and second split-off beams are spatially separated to provide for wavelength and power monitoring. The portion of light tapped off of the output beam 14 by the partially mirrored beam tap 18 is no longer available for coupling into a fiber, and thus the output beam 24 is reduced by a percentage that reflects the portion of light tapped off of the output beam 14.

Prior art front facet wavelength monitors use beam splitters in a similar configuration to tap a small percentage of the optical power of an output beam for wavelength and power monitoring. However, such prior wavelength monitors reduce the optical power of the output beam to a greater extent than the present invention.

In the preferred embodiment, the partially mirrored beam tap 18 reduces the optical power from the elliptical portion of the output beam 14, but minimizes the impact on fiber 26 coupling efficiency. Specifically, the partially mirrored beam tap 18 splits off the first and second split-off beams from upper and lower tails of the elliptical Gaussian output beam 14, so that the light is taken from portions of the output beam 14 that are weakly coupled into the fiber 26. The area of the tapped light is also reduced, thereby providing higher optical power densities into the detectors 22 and allowing for smaller, less expensive detectors 22.

Figure 2:
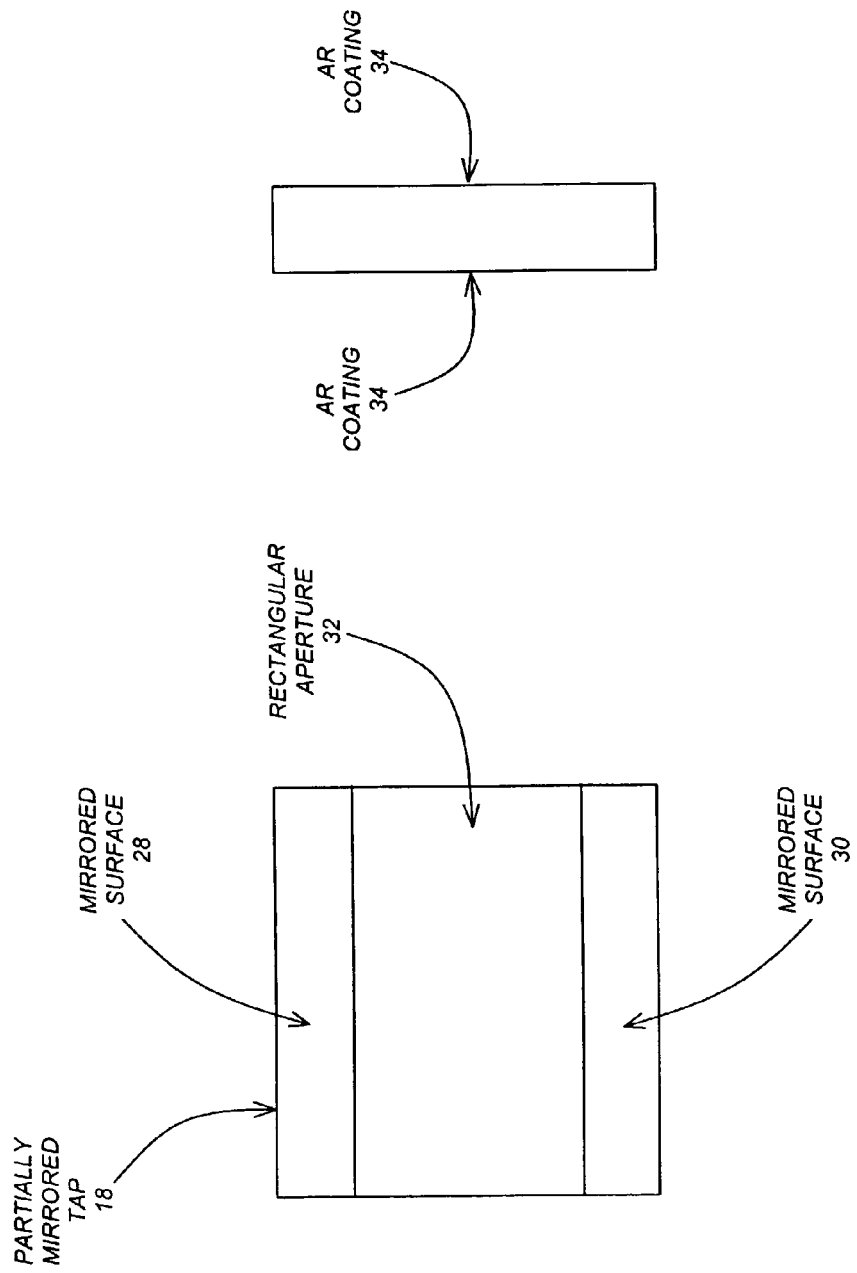
FIGS. 2A and 2B illustrate the structure of the partially mirrored beam tap according to the preferred embodiment of the present invention.

FIGS. 2A and 2B illustrate the structure of the partially mirrored beam tap 18 according to the preferred embodiment of the present invention. As shown in the perspective view of FIG. 2A, upper and lower portions of the partially mirrored beam tap 18 comprise mirrored surfaces 28 and 30 that reflect the upper and lower tails of the output beam 14, while a center portion of the partially mirrored beam tap 18 comprises a clear rectangular aperture 32 that passes the remainder of the output beam 14 as output beam 24. The side view of FIG. 2B illustrates that an anti-reflective (AR) coating 34 may be applied to the clear rectangular aperture 32 on both sides of the tap 18.

Figure 3:
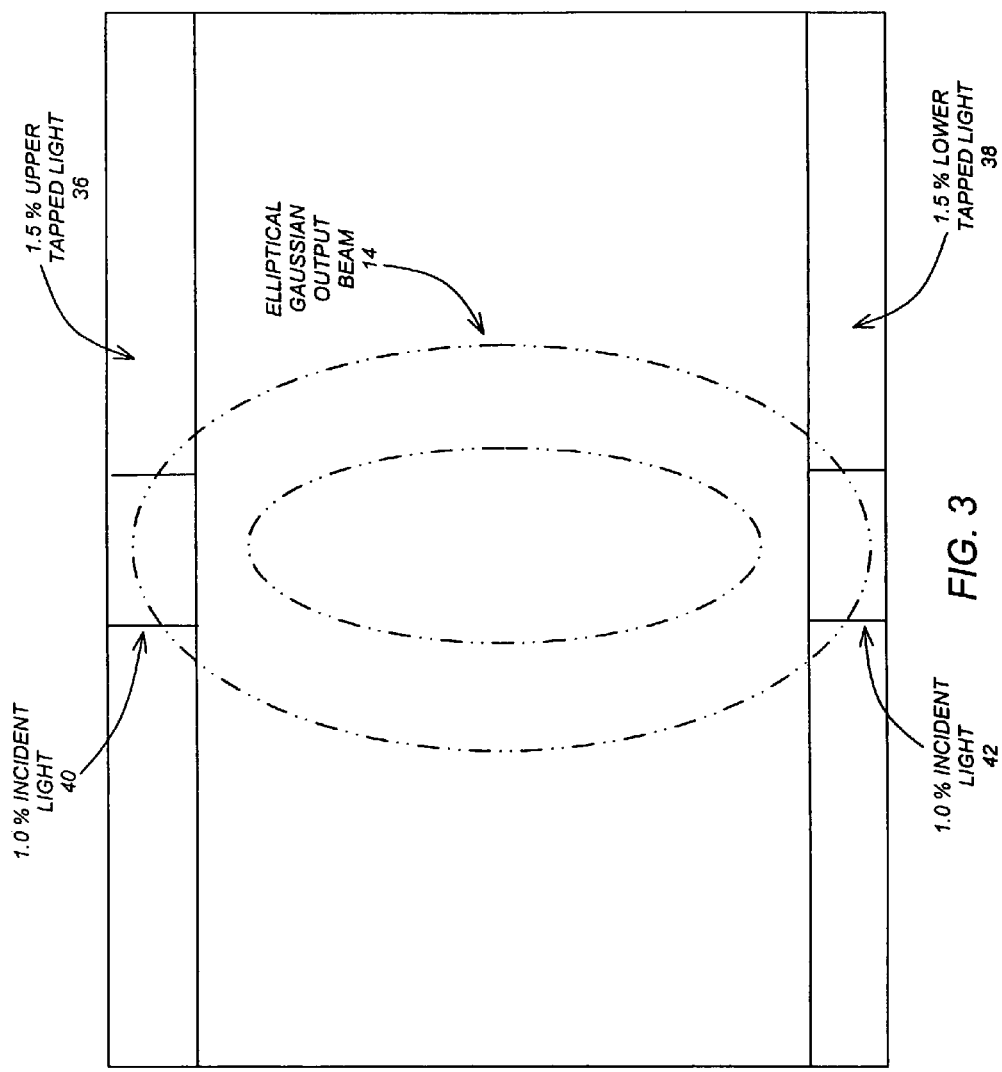
FIG. 3 illustrates how the partially mirrored beam tap operates on the elliptical Gaussian output beam according to the preferred embodiment of the present invention.

FIG. 3 illustrates how the partially mirrored beam tap 18 operates on the elliptical Gaussian output beam 14 according to the preferred embodiment of the present invention. The rectangular areas 36 and 38 illustrate that the upper and lower mirrored surfaces 28 and 30 of the partially mirrored beam tap 18 each intersect and reflect approximately 1.5% of the output beam 14. However, the rectangular areas 40 and 42 illustrate the portions of the upper and lower mirrored surfaces 28 and 30 that each intersect and reflect approximately 1.0% of the output beam 14 directly into the etalon 20 and photo-detectors 22, because the surface area of the etalon 20 and first and second photo-detectors 22 is less than the surface area of the upper and lower mirrored surfaces 28 and 30.

Figure 4:
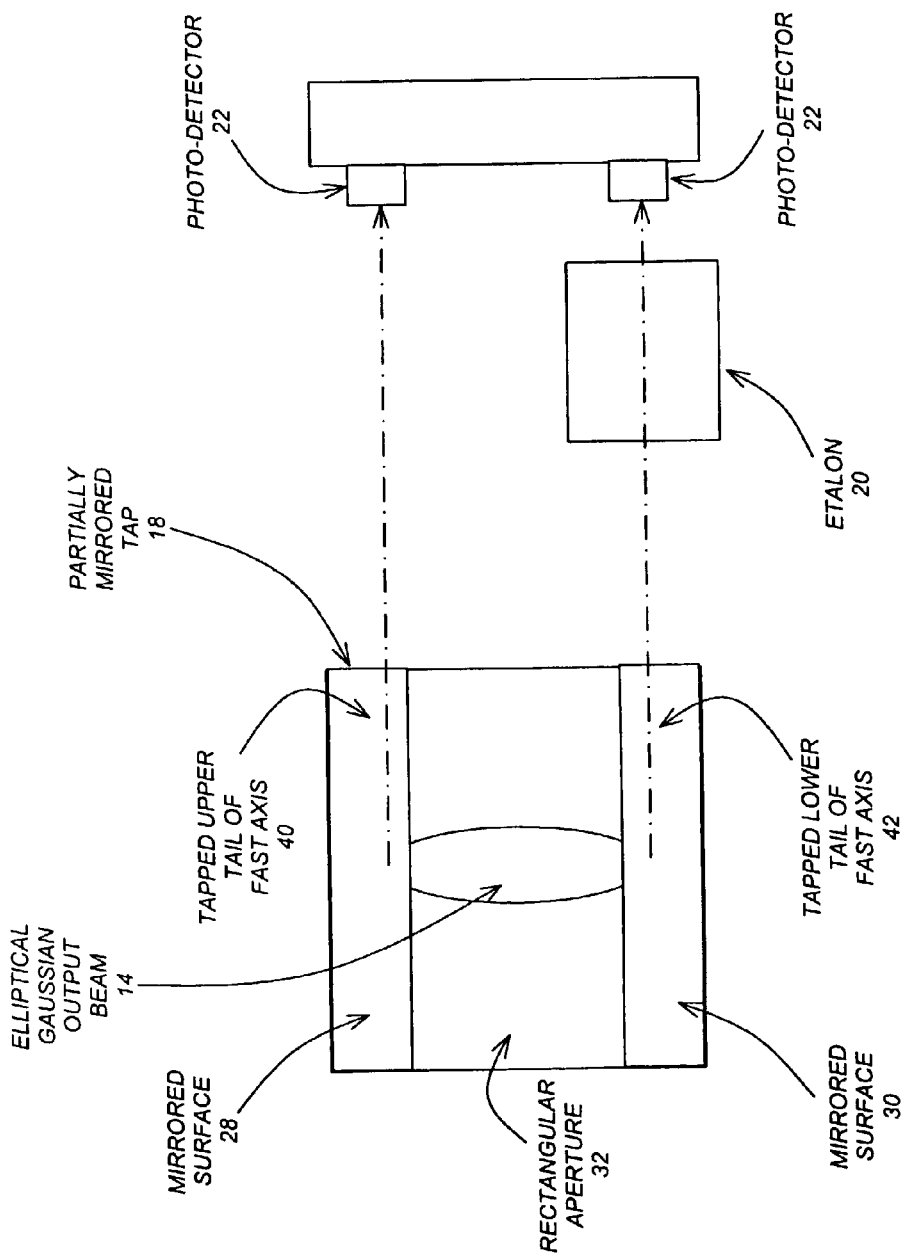
FIG. 4 is a perspective view that further illustrates the structure and operation of the partially mirrored beam tap according to the preferred embodiment of the present invention.

FIG. 4 is a perspective view that further illustrates the structure and operation of the partially mirrored beam tap 18 according to the preferred embodiment of the present invention. The dotted lines represent the first and second split-off beams 40 and 42 comprising the upper and lower tails of the elliptical Gaussian output beam 14 along a fast axis of the output beam 14. In this embodiment, the upper tail 40 is incident on a first photo-detector 22, while the lower tail 42 is transmitted through the etalon 20 and thereafter is incident on a second photo-detector 22.

Figure 5:
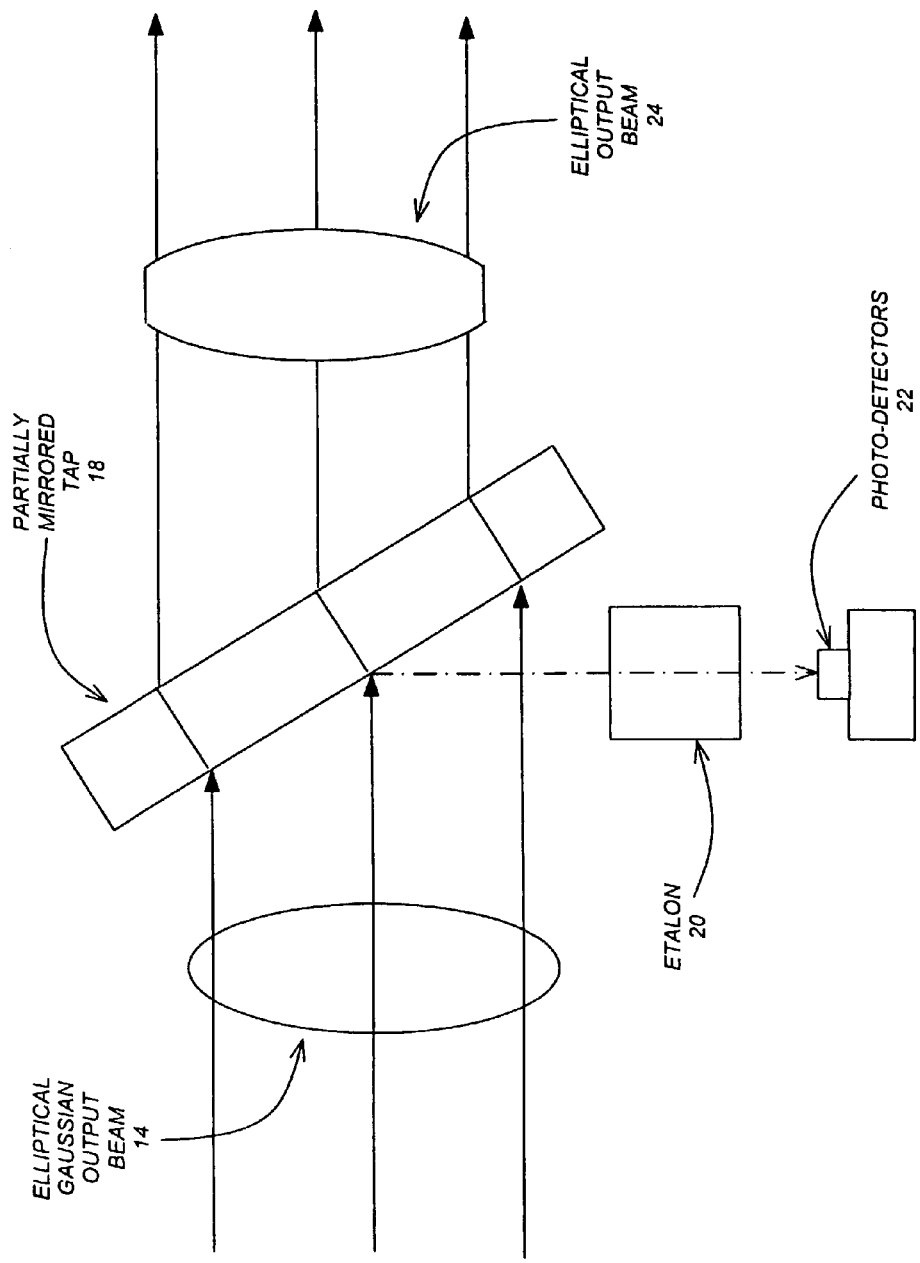
FIG. 5 is a top view that further illustrates the structure and operation of the partially mirrored beam tap according to the preferred embodiment of the present invention.

FIG. 5 is a top view that further illustrates the structure and operation of the partially mirrored beam tap 18 according to the preferred embodiment of the present invention. The solid lines represent the output beam 14 that is transmitted through the clear rectangular aperture 32 of the partially mirrored beam tap 18 as output beam 24, while the dotted line represents the first and second split-off beams 40 and 42 that are reflected by the upper and lower mirrored surfaces 28 and 30 of the partially mirrored beam tap 18 directly onto the first photo-detectors 22 and through the etalon 20 and onto the second photo-detectors 22, respectively.

In the preferred embodiment, for a 2:1 elliptical Gaussian output beam 14 (2:1 meaning that the fast axis is 2× the length of the slow axis) that has 99% of its optical power contained in a 0.5 mm×1.0 mm rectangular area, a partially mirrored beam tap 18 can be constructed with a clear rectangular aperture 32 of 0.5 mm×0.8 mm, thereby allowing for 97% of the optical power of the output beam 14 to be transmitted as the output beam 24, and 1.5% of the optical power of the output beam 14 to be reflected by each mirrored surface 28 and 30 as beams into the photo-detectors 22. At least one 200 µm×100 µm photo-detector 22 is placed in each reflected beam's path, so that the reference and etalon photo-detectors 22 each capture 1% of the optical power of the output beam 14 incident on the partially mirrored beam tap 14.

Although the light tapped totals 3% of the total optical power of the output beam 14, the impact on the amount of the output beam 24 coupled into the fiber 26 is significantly less than the 2% of the total optical power required by prior art beam splitters. Moreover, to deliver the same power to the photo-detectors 22, a prior art wavelength locker would require photo-detectors having more than 20× the surface area as compared to the area for the photo-detectors 22 used with the partially mirrored beam tap 18 of the present invention.

FIGS. 6A and 6B illustrate possible alternative configurations of the photo-detectors 22. While one embodiment may envision a single photo-detector 22 for each of the beams reflected by the partially mirrored beam tap 18, other embodiments may comprise quad photo-detectors 22, as shown in FIG. 6A, or dual photo-detectors 22, as shown in FIG. 6B. These alternative embodiments are especially useful in cases where beam movement is a concern. For example, quad photo-detectors 22 can detect beam movement in two axes (i.e., vertically and horizontally), while dual photo-detectors 22 can detect beam movement in one axis (i.e., vertically or horizontally). Of course, those skilled in the art will recognize that any number and configuration of photo-detectors may be used in the present invention.

CONCLUSION

This concludes the description of the preferred embodiment of the invention. The following describes some alternative embodiments for accomplishing the present invention.

For example, different configurations and different numbers of partially mirrored beam taps other than those explicitly described herein could be used without departing from the scope of the present invention. In addition, different mirroring and different constructions of the mirrored surfaces and apertures other than those explicitly described herein could be used without departing from the scope of the present invention. Moreover, different configurations of photo-detectors other than those explicitly described herein could be used without departing from the scope of the present invention. Finally, other configurations of output beams, other than elliptical Gaussian output beams, could be tapped in ways other than those explicitly described herein without departing from the scope of the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A wavelength locker for use in monitoring a wavelength and power of an output beam from a laser, comprising:

a planar partially mirrored beam tap for splitting off at least first and second beams from tails of an elliptical output beam, wherein upper and lower portions of the partially mirrored beam tap comprise mirrored surfaces that reflect the tails of the output beam, and a center portion of the partially mirrored beam tap comprises a clear aperture that passes a remainder of the output beam, wherein the first split-off beam is transmitted to an etalon and one or more first photo-detectors for wavelength monitoring, while the second split-off beam is transmitted to one or more second photo-detectors as a reference and for power monitoring, and wherein the first and second photo-detectors are configured to detect beam movement.

2. The wavelength locker of claim 1, wherein the first and second photo-detectors are configured as dual photo-detectors that can detect beam movement in one axis.

3. The wavelength locker of claim 1, wherein the first and second photo-detectors are each configured as quad photo-detectors that can detect beam movement in two axes.

4. A method of monitoring a wavelength and power of an output beam from a laser using a wavelength locker, comprising:

splitting off at least first and second beams from tails of an elliptical output beam using a planar partially mirrored beam tap, wherein upper and lower portions of the partially mirrored beam tap comprise mirrored surfaces that reflect the tails of the output beam, and a center portion of the partially mirrored beam tap comprises a clear aperture that passes a remainder of the output beam, wherein the first split-off beam is transmitted to an etalon and one or more first photo-detectors for wavelength monitoring, while the second split-off beam is transmitted to one or more second photo-detectors as a reference and for power monitoring, and wherein the first and second photo-detectors are configured to detect beam movement.

5. The method of claim 4, wherein the first and second photo-detectors are configured as dual photo-detectors that can detect beam movement in one axis.

6. The method of claim 4, wherein the first and second photo-detectors are each configured as quad photo-detectors that can detect beam movement in two axes.

7. An optoelectronic device, comprising: a laser for generating an output beam; and a wavelength locker for use in monitoring a wavelength and power of an output beam from a laser, the wavelength locker including a planar partially mirrored beam tap for splitting off at least first and second beams from tails of an elliptical output beam, wherein upper and lower portions of the partially mirrored beam tap comprise mirrored surfaces that reflect the tails of the output beam, and a center portion of the partially mirrored beam tap comprises a clear aperture that passes a remainder of the output beam, wherein the first split-off beam is transmitted to an etalon and one or more first photo-detectors for wavelength monitoring, while the second split-off beam is transmitted to one or more second photo-detectors as a reference and for power monitoring, and wherein the first and second photo-detectors are configured to detect beam movement.

8. The optoelectronic device of claim 7, wherein the first and second photo-detectors are configured as dual photo-detectors that can detect beam movement in one axis.

9. The optoelectronic device of claim 7, wherein the first and second photo-detectors are each configured as quad photo-detectors that can detect beam movement in two axes.

* * * * *